US009324820B1

(12) United States Patent
Kelly et al.

(10) Patent No.: US 9,324,820 B1
(45) Date of Patent: Apr. 26, 2016

(54) METHOD FOR FORMING SEMICONDUCTOR STRUCTURE WITH METALLIC LAYER OVER SOURCE/DRAIN STRUCTURE

(71) Applicant: Taiwan Semiconductor Manufacturing Co., Ltd, Hsin-Chu (TW)

(72) Inventors: Andrew Joseph Kelly, Hengshan Township, Hsinchu County (TW); Yusuke Oniki, Hsinchu (TW)

(73) Assignee: TAIWAN SEMICONDUCTOR MANUFACTURING CO., LTD, Hsin-Chu (TW)

( * ) Notice: Subject to any disclaimer, the term of this patent is extended or adjusted under 35 U.S.C. 154(b) by 0 days.

(21) Appl. No.: 14/608,805

(22) Filed: Jan. 29, 2015

(51) Int. Cl.
*H01L 29/417* (2006.01)
*H01L 29/66* (2006.01)
*H01L 21/324* (2006.01)
*H01L 21/306* (2006.01)
*H01L 21/283* (2006.01)
*H01L 21/82* (2006.01)
*H01L 21/3065* (2006.01)
*H01L 21/8234* (2006.01)

(52) U.S. Cl.
CPC ........ *H01L 29/41783* (2013.01); *H01L 21/283* (2013.01); *H01L 21/3065* (2013.01); *H01L 21/324* (2013.01); *H01L 21/823437* (2013.01); *H01L 21/823443* (2013.01); *H01L 29/41791* (2013.01); *H01L 29/665* (2013.01); *H01L 29/66507* (2013.01); *H01L 29/66515* (2013.01); *H01L 29/66795* (2013.01)

(58) Field of Classification Search
CPC ............... H01L 29/41783; H01L 29/41791; H01L 29/665; H01L 29/66507; H01L 29/66515; H01L 21/823418; H01L 21/823814; H01L 21/823443
See application file for complete search history.

(56) References Cited

U.S. PATENT DOCUMENTS

| | | | |
|---|---|---|---|
| 6,562,726 B1 | 5/2003 | Torek et al. | |
| 8,278,191 B2 | 10/2012 | Hildreth et al. | |
| 9,093,298 B2 * | 7/2015 | Ekbote | H01L 27/088 |
| 2005/0051900 A1 | 3/2005 | Liu et al. | |
| 2010/0248449 A1 | 9/2010 | Hildreth et al. | |
| 2011/0062411 A1 | 3/2011 | Bangsaruntip et al. | |
| 2011/0210404 A1 | 9/2011 | Su et al. | |
| 2012/0064712 A1 | 3/2012 | Lei et al. | |
| 2012/0074498 A1 | 3/2012 | Chuang et al. | |
| 2013/0307034 A1 | 11/2013 | Yin et al. | |
| 2014/0042500 A1 | 2/2014 | Wann et al. | |
| 2014/0061817 A1 | 3/2014 | Gan et al. | |
| 2014/0179077 A1 | 6/2014 | Chen et al. | |
| 2014/0291734 A1 | 10/2014 | Cheng et al. | |
| 2015/0214059 A1 | 7/2015 | Bouche et al. | |

* cited by examiner

*Primary Examiner* — Thanhha Pham
(74) *Attorney, Agent, or Firm* — Birch, Stewart, Kolasch & Birch, LLP

(57) ABSTRACT

A semiconductor structure and a method for forming the same are provided. The method for manufacturing a semiconductor structure includes forming a source/drain structure over a substrate and forming a metal layer on the source/drain structure. The method for manufacturing a semiconductor structure further includes reacting a portion of the metal layer with the source/drain structure to form a metallic layer on the source/drain structure. The method for manufacturing a semiconductor structure further includes removing an unreacted portion of the metal layer on the metallic layer by an etching process. In addition, the etching process includes using an etchant including HF and propylene carbonate, and the volume ratio of HF to propylene carbonate in the etchant is in a range from about 1:10 to about 1:10000.

20 Claims, 16 Drawing Sheets

METHOD FOR FORMING SEMICONDUCTOR STRUCTURE WITH METALLIC LAYER OVER SOURCE/DRAIN STRUCTURE

CROSS REFERENCE TO RELATED APPLICATIONS

This application is related to the co-pending a commonly assigned patent application U.S. Ser. No. 14/525,888, filed on Oct. 28, 2014 and entitled "SEMICONDUCTOR STRUCTURE WITH CONTACT OVER SOURCE/DRAIN STRUCTURE AND METHOD FOR FORMING THE SAME", the entirety of which is incorporated by reference herein.

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

One of the important drivers for increased performance in computers is the higher levels of integration of circuits. This is accomplished by miniaturizing or shrinking device sizes on a given chip. Tolerances play an important role in being able to shrink dimensions on a chip.

However, although existing semiconductor manufacturing processes have generally been adequate for their intended purposes, as device scaling-down continues, they have not been entirely satisfactory in all respects.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1A:
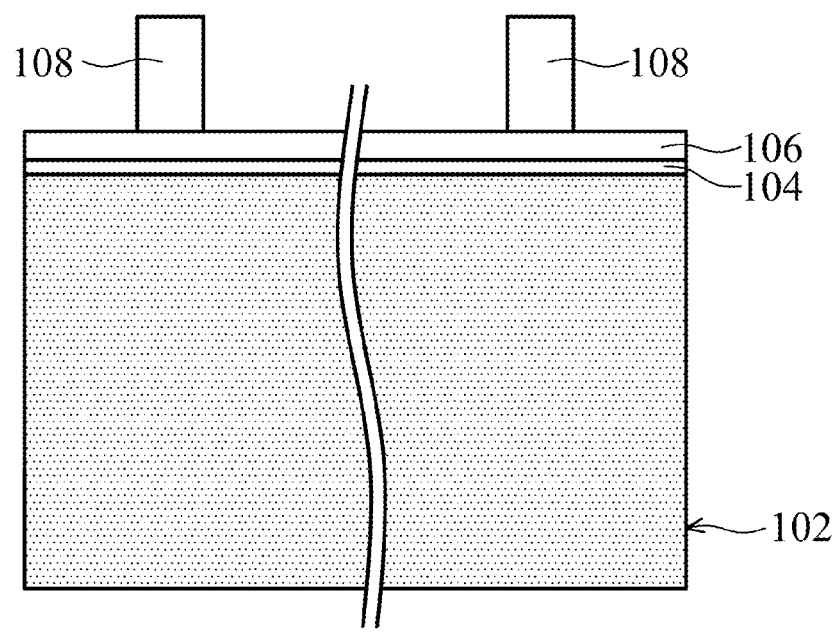
FIGS. 1A to 1K are cross-sectional representations of various stages of forming a semiconductor structure in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments of methods for forming semiconductor structures are provided in accordance with some embodiments of the disclosure. The semiconductor structure includes a source/drain structure, and a metallic layer is formed over the source/drain structure. The metallic layer may be formed by forming a metal layer over the source/drain structure, annealing the metal layer to react with the source/drain structure to form the metallic layer, and removing the unreacted metal layer over the metallic layer. In addition, an etchant may be used to remove the unreacted metal layer.

FIGS. 1A to 1K are cross-sectional representations of various stages of forming a semiconductor structure 100 in accordance with some embodiments. As shown in FIG. 1A, a substrate 102 is provided in accordance with some embodiments. Substrate 102 may be a semiconductor wafer such as a silicon wafer. Alternatively or additionally, substrate 102 may include elementary semiconductor materials, compound semiconductor materials, and/or alloy semiconductor materials. Examples of the elementary semiconductor materials may be, but are not limited to, crystal silicon, polycrystalline silicon, amorphous silicon, germanium, and/or diamond. Examples of the compound semiconductor materials may be, but are not limited to, silicon carbide, gallium arsenic, gallium phosphide, indium phosphide, indium arsenide, and/or indium antimonide. Examples of the alloy semiconductor materials may be, but are not limited to, SiGe, GaAsP, AlInAs, AlGaAs, GaInAs, GaInP, and/or GaInAsP.

In addition, substrate 102 may include structures such as doped regions, interlayer dielectric (ILD) layers, conductive features, and/or isolation structures. Furthermore, substrate 102 may further include single or multiple material layers to be patterned. For example, the material layers may include a silicon layer, a dielectric layer, and/or a doped poly-silicon layer.

A dielectric layer 104 and a mask layer 106 are formed over substrate 102, and a photo-sensitive layer 108 is formed over mask layer 104, as shown in FIG. 1A in accordance with some embodiments. Dielectric layer 104 may be used as an adhesion layer between substrate 102 and mask layer 106. In addition, dielectric layer 104 may also be used as an etch stop layer for etching mask layer 106. In some embodiments, dielectric layer 104 is made of silicon oxide. Dielectric layer 104 may be formed by using a thermal oxidation process, although other deposition processes may be used in some other embodiments.

Mask layer 106 may be used as a hard mask during subsequent photolithography processes. In some embodiments, mask layer 106 is made of silicon nitride. Mask layer 106 may be formed by using low-pressure chemical vapor deposition (LPCVD) or plasma enhanced chemical vapor deposition (PECVD), although other deposition processes may also be used in some other embodiments.

Figure 1B:
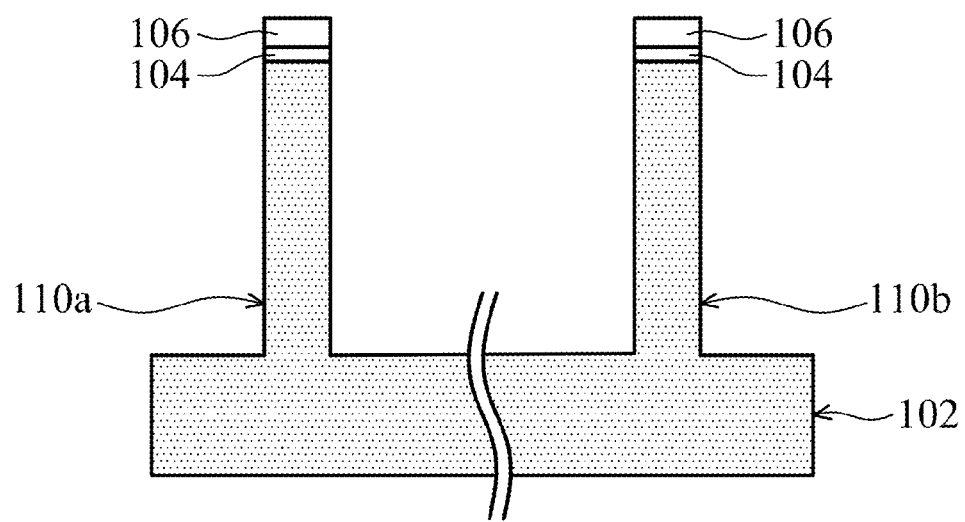

Next, a first fin structure 110a and a second fin structure 110b are formed by sequentially etching mask layer 106, dielectric layer 104, and substrate 102 through photo-sensitive layer 108, as shown in FIG. 1B in accordance with some embodiments. Afterwards, photo-sensitive layer 108 is removed.

Figure 1C:
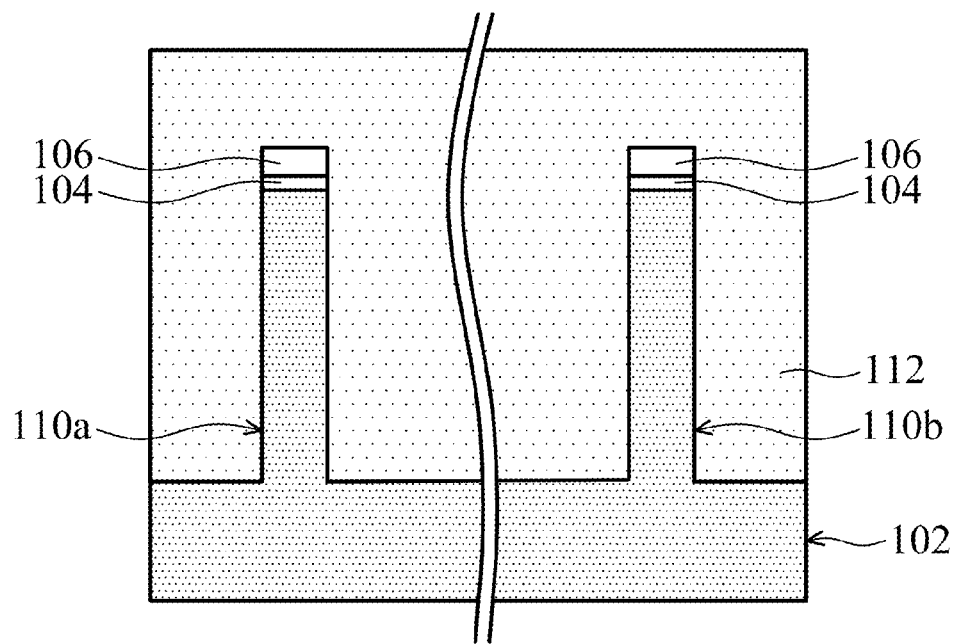

After first fin structure 110a and second fin structure 110b are formed, an insulating layer 112 is formed over substrate 102 to cover first fin structure 110a and second fin structure 110b, as shown in FIG. 1C in accordance with some embodiments. In some embodiments, insulating layer 112 is made of silicon oxide, silicon nitride, silicon oxynitride, fluoride-doped silicate glass (FSG), or other low-K dielectric materials. Insulating layer 112 may be formed by using a high-density-plasma (HDP) CVD process, although other deposition processes may be used in other embodiments.

Figure 1D:
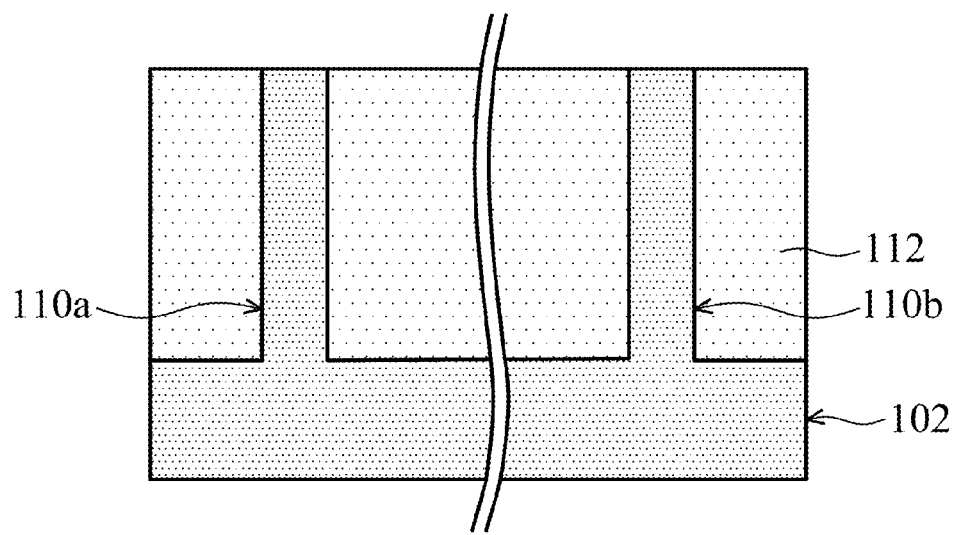

After insulating layer 112 is formed, the top portion of insulating layer 112, mask layer 106, and dielectric layer 104 are removed to expose the top surfaces of first fin structure 110a and second fin structure 110b, as shown in FIG. 1D in accordance with some embodiments. In some embodiments, a chemical mechanical polishing (CMP) process is performed.

Figure 1E:
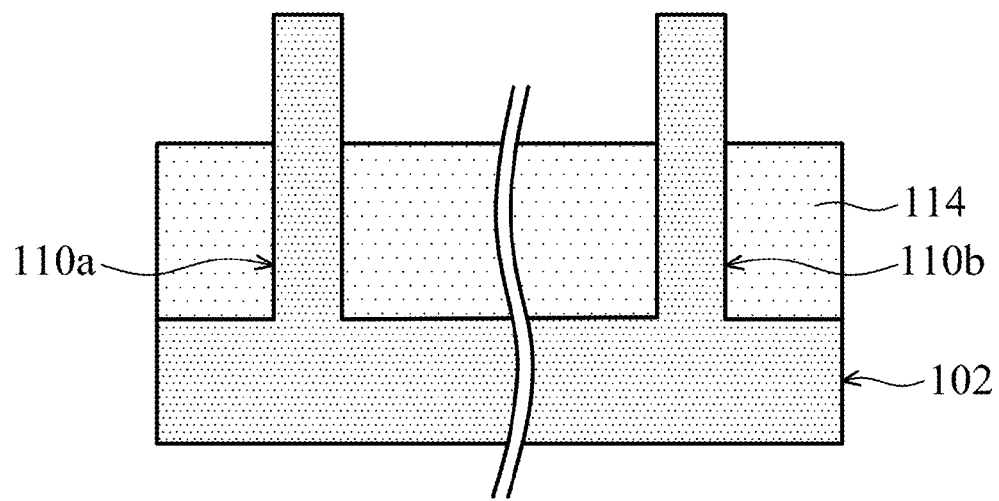

Next, insulating layer 112 is recessed to form a shallow trench isolation structure 114 around first fin structure 110a and second fin structure 110b, as shown in FIG. 1E in accordance with some embodiments. Insulating layer 112 may be recessed by a wet etching process or a dry etching process.

Afterwards, a gate structure (not shown in FIG. 1F) may be formed over first fin structure 110a and second fin structure 110b in accordance with some embodiments. The gate structure may be formed across first fin structure 110a and second fin structure 110b and extends over shallow trench isolation structure 114. In some embodiments, the gate structure is made of polysilicon. In some embodiments, the gate structure is a dummy gate structure which will be replaced by a metal gate structure afterwards.

Figure 1F:
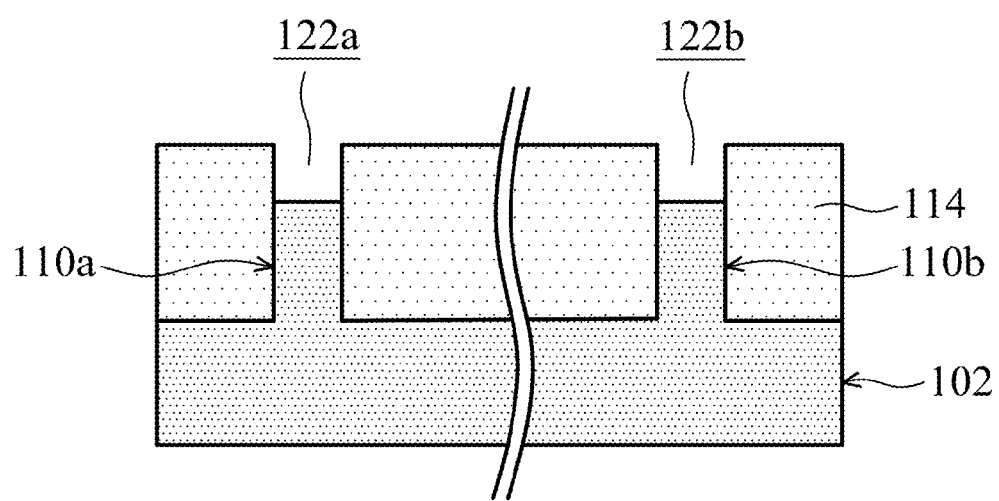

After the gate structure is formed, a portion of first fin structure 110a is etched to form a first recess 122a and a portion of second fin structure 110b is etched to form a second recess 122b, as shown in FIG. 1F in accordance with some embodiments. In some embodiments, two first recesses 122a are formed at the opposite sides of first fin structure 110a adjacent to the gate structure, and two second recesses 122b are formed at the opposite sides of second fin structure 110b adjacent to the gate structure. In some embodiments, the top surfaces of first recess 122a and second recess 122b are lower than the top surface of shallow trench isolation structure 114 in accordance with some embodiments.

Figure 1G:
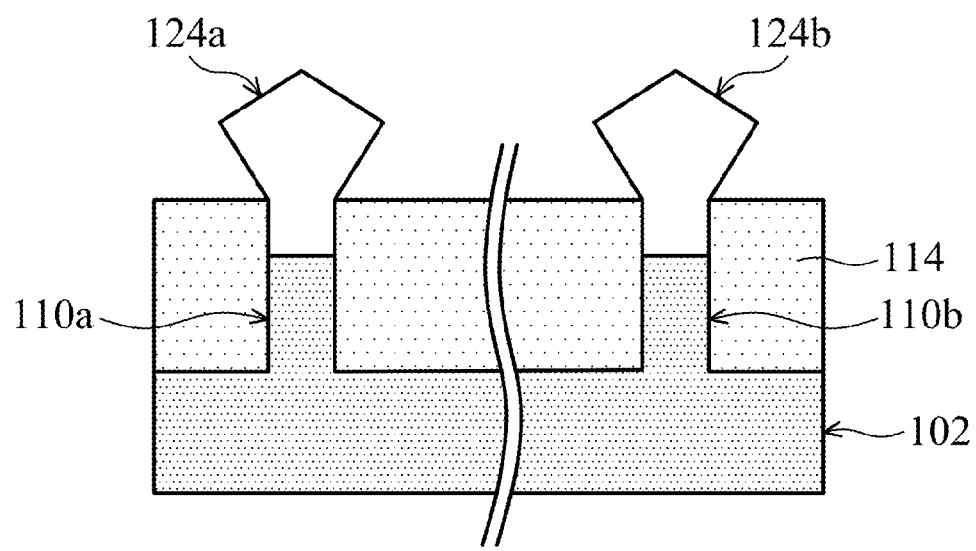

After first recess 122a and second recess 122b are formed, a first source/drain structure 124a is formed in first recess 122a over first fin structures 110a of substrate 102 and a second source/drain structure 124b is formed in second recess 122b over second fin structure 110b of substrate 102, as shown in FIG. 1G in accordance with some embodiments. In some embodiments, first source/drain structure 124a and second source/drain structure 124b are raised source/drain structures having diamond shaped structures over substrate 102.

First source/drain structure 124a and second source/drain structure 124b may be formed by growing strained materials in first recess 122a and second recess 122b by an epitaxial (epi) process. In some embodiments, first source/drain structure 124a is made of GaAs, InAs, InGaAs, InAlAs, InP, InAlP, InN, GaN, InGaN, InGaP, GaSb, InSb, or InAsSbP. In some embodiments, second source/drain structure 124b is made of GaAs, InAs, InGaAs, InAlAs, InP, InAlP, InN, GaN, InGaN, InGaP, GaSb, InSb, or InAsSbP.

In some embodiments, first source/drain structure 124a and second source/drain structure 124b are made of different materials. In some embodiments, first source/drain structure 124a is made of group IIIA-VA alloy, and second source/drain structure 124b is made of group IVA element or group IVA alloy. In some embodiments, first source/drain structure is made of GaAs, InAs, InGaAs, InAlAs, InP, InAlP, InN, GaN, InGaN, InGaP, GaSb, InSb, or InAsSbP, and second source/drain structure 124b is made of Ge or SiGe.

Figure 1H:
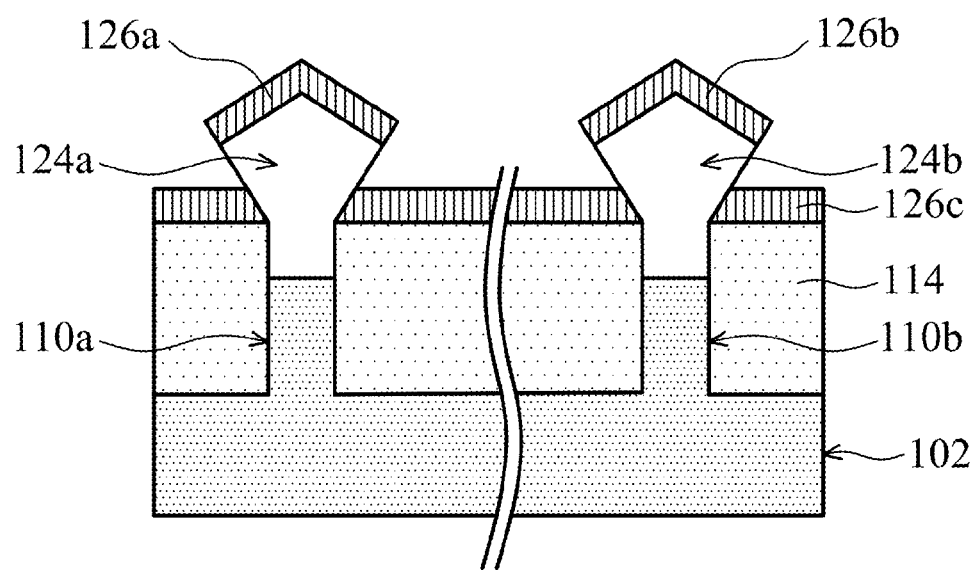

After first source/drain structure 124a and second source/drain structure 124b are formed, a first metal layer 126a and a second metal layer 126b are formed over first source/drain structure 124a and second source/drain structure 124b respectively, as shown in FIG. 1H in accordance with some embodiments. In some embodiments, first metal layer 126a and second metal layer 126b are formed by forming a metal layer over substrate 102 to cover the top surfaces of first source/drain structure 124a and second source/drain structure 124b. In addition, a portion 126c of the metal layer may also be formed over the top surface of shallow trench isolation structure 114, as shown in FIG. 1H in accordance with some embodiments. In some embodiments, first metal layer 126a and second metal layer 126b are made of the same material. In some embodiments, first metal layer 126a and second metal layer 126b are made of Ni, Co, Mo, Ti, Al, Sn, Pd, Pt, Au, Ag, or Cu.

Figure 1I:
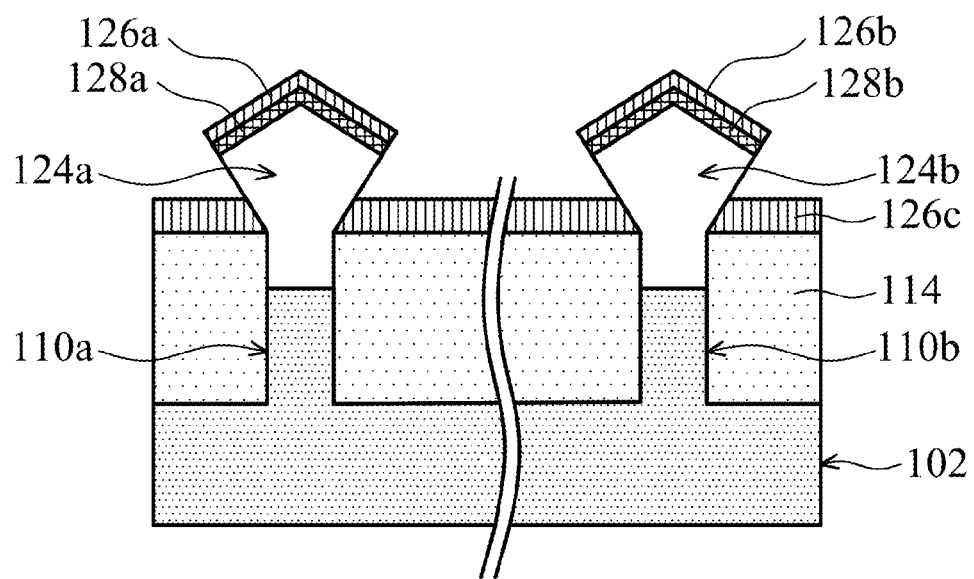

After first metal layer 126a and second metal layer 126b are formed, an annealing process is performed to form a first metallic layer 128a and a second metallic layer 128b, as shown in FIG. 1I in accordance with some embodiments. More specifically, during the annealing process, the bottom portion of first metal layer 126a, which is in direct contact with first source/drain structure 124a, reacts with the top surface of first source/drain structure 124a to form first metallic layer 128a. Accordingly, first metallic layer 128a is formed on first source/drain structure 124a. For example, if first source/drain structure 124a is made of group III-VA alloy, such as InAs, and first metal layer 126a is made of Ni, the resulting first metallic layer 128a will be made of NiInAs.

Similarly, during the annealing process, the bottom portion of second metal layer 126b, which is in direct contact with second source/drain structure 124b, reacts with the top surface of second source/drain structure 124b to form second metallic layer 128b. Accordingly, second metallic layer 128b is formed on second source/drain structure 124b. For example, if second source/drain structure 124b is made of group IVA element or group IVA alloy, such as Ge, and second metal layer 126b is made of Ni, the resulting second metallic layer 128b will be made of NiGe.

Example materials used to form first metallic layer 128a and second metallic layer 128b include, but are not limited to, NiGe, NiSiGe, NiInGaAs, CoInAs, TiInGaAs, TiGe, Ni2Ge, NiGe2, TiGe2, Ti2Ge, NiInAs, TiInAs, Ni2InAs, Ti2InAs, Co2InAs, NiGaAs, Ni2GaAs, TiGaAs, CoGaAs, or the like.

In some embodiments, the annealing process is performed under a temperature no greater than 400° C. If the annealing process is performed at a temperature that is too high, the resulting metallic layer, such as made of NiInAs, may be thermally unstable and segregates, resulting in a rough interface between the source/drain structure and the metallic layer. In some embodiments, the annealing process is a rapid thermal annealing (RTA) process.

Figure 1J:
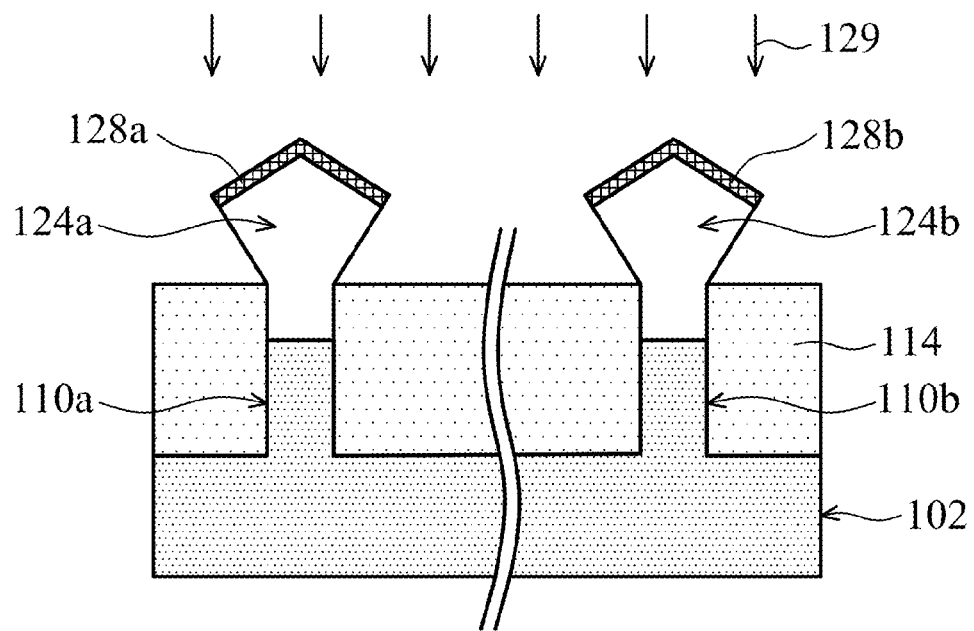

After first metallic layer 128a and second metallic layer 128b are formed, an etching process 129 is performed to remove the unreacted portion of the metal layer, as shown in FIG. 1J in accordance with some embodiments. In addition, portion 126c is also removed during etching process 129. In some embodiments, etching process 129 includes using an etchant.

In some embodiments, the etchant used in etching process 129 includes HF and propylene carbonate (PC). In some embodiments, a volume ratio of HF to propylene carbonate in the etchant is in a range from about 1:10 to about 1:10000. HF used in the etchant may be a HF solution. In some embodiments, the concentration of HF solution is 49% (in water). Accordingly, if the etchant does not contain enough amount of propylene carbonate, a great proportion of the etchant will be water, resulting in reducing the etching selectivity.

In some embodiments, the etching rate of the unreacted portion of first metal layer 126a is at least twenty times greater than the etching rate of first metallic layer 128a during etching process 129. That is, the ratio of the etching rate of the unreacted portion of first metal layer 126a to the etching rate of first metallic layer 128a is greater than 20 in etching process 129. Since the etchant has good selectivity toward the unreacted portion of first metal layer 126a and first metallic layer 128a, by using the etchant, the unreacted portion of first metal layer 126a can be removed but first metallic layer 128a will not be removed.

In addition, the etching rate of the unreacted portion of second metal layer 126b is at least twenty times greater than the etching rate of second metallic layer 128b during etching process 129 in accordance with some embodiments. That is, the etchant also has good selectivity toward the unreacted portion of second metal layer 126b and second metallic layer 128b. Therefore, by using the etchant, the unreacted portion of second metal layer 126b can be removed but second metallic layer 128b will not be removed. In some embodiments, the etching process is performed at a temperature in a range from about 20° C. to about 150° C.

Furthermore, the etching selectivity of the metal layer (e.g. first metal layer 126a and second metal layer 126b) over dielectric materials (e.g. $SiO_2$ or SiN) in the etchant is high. In some embodiments, the ratio of the etching rate of Ni to the etching rate of SiO2 or SiN is greater than 20. Accordingly, etching process 129 can be performed even when other dielectric structures, such as spacers, inter-level dielectric layers, or shallow trench isolation structures, are present.

In some embodiments, first source/drain structure 124a and second source/drain structure are made of different materials. For example, first source/drain structure 124a may be made of InAs, and second source/drain structure may be made of Ge. In addition, the metal layer may be made of Ni. Accordingly, first metallic layer 128a may be made of NiInAs and second metallic layer 128b may be made of NiGe. Etching process 129 is performed on both first metal layer 126a and second metal layer 126b to remove the unreacted portion of first metal layer 126a and second metal layer 126b. In some embodiments, a volume ratio of HF to propylene carbonate in the etchant is in a range from about 1:50 to about 1:200. In some embodiments, the etching process is performed at a temperature in a range from about 50° C. to about 100° C. As described previously, although first metallic layer 128a and second metallic layer 128b are made of different materials, the etchant used in etching process 129 may have great etching selectivity over first metal layer 126a and first metallic layer 128a and also toward second metal layer 126b and second metallic layer 128b.

Figure 1K:
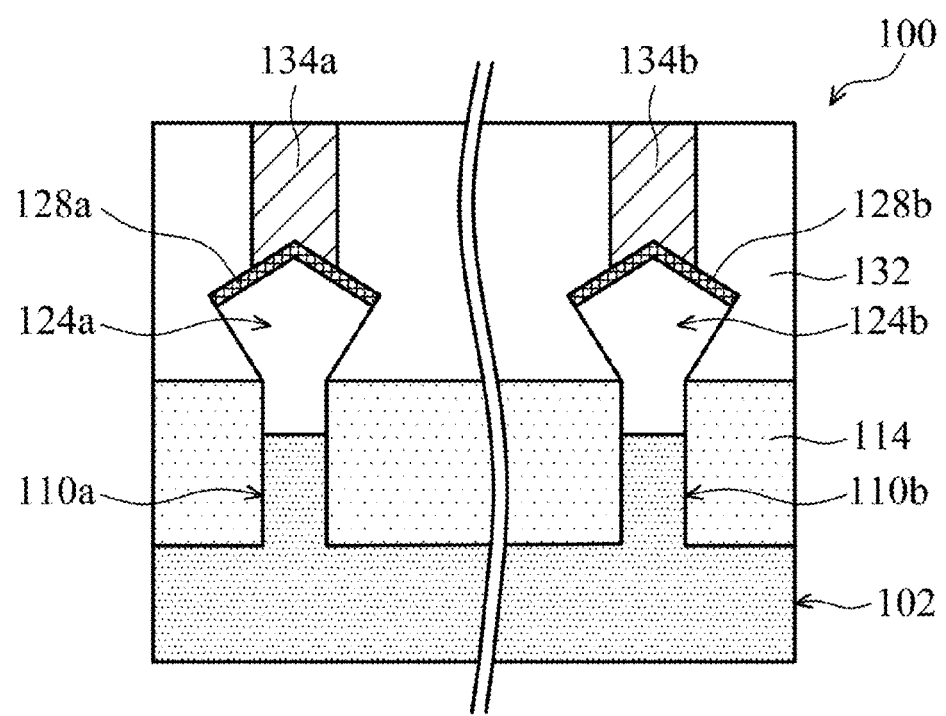

After first metallic layer 128a and second metallic layer 128b are formed, an inter-layer dielectric (ILD) layer 132 is formed over substrate 102, as shown in FIG. 1K in accordance with some embodiments. In addition, first source/drain structure 124a, second source drain structure 124b, and shallow trench isolation structure 114 are all covered by inter-layer dielectric layer 132.

Inter-layer dielectric layer 132 may include multilayers made of multiple dielectric materials, such as silicon oxide, silicon nitride, silicon oxynitride, phosphosilicate glass (PSG), borophosphosilicate glass (BPSG), low-k dielectric material, and/or other applicable dielectric materials. Examples of low-k dielectric materials include, but are not limited to, fluorinated silica glass (FSG), carbon doped silicon oxide, amorphous fluorinated carbon, parylene, bis-benzocyclobutenes (BCB), or polyimide. Inter-layer dielectric layer 132 may be formed by chemical vapor deposition (CVD), physical vapor deposition, (PVD), atomic layer deposition (ALD), spin-on coating, or other applicable processes.

After inter-layer dielectric layer 132 is formed, a first contact 134a and a second contact 134b are formed through inter-layer dielectric layer 132, as shown in FIG. 1K in accordance with some embodiments. First contact 134a and second contact 134b may be formed by forming contact trenches in inter-layer dielectric layer 132 over first source/drain structure 124a and second source/drain structure 124b and filling the contact trenches by a conductive material.

In some embodiments, the conductive material used to make first contact 134a and second contact 134b includes aluminum (Al), copper (Cu), tungsten (W), titanium (Ti), tantalum (Ta), titanium nitride (TiN), tantalum nitride (TaN), nickel silicide (NiS), cobalt silicide (CoSi), tantalum carbide (TaC), tantalum silicide nitride (TaSiN), tantalum carbide nitride (TaCN), titanium aluminide (TiAl), titanium aluminide nitride (TiAlN), other applicable conductive materials, or a combination thereof. In some embodiments, both first contact 134a and second contact 134b include a titanium nitride layer and tungsten formed over the titanium nitride layer.

In addition, first contact 134a and second contact 134b may further include a liner and/or a barrier layer. For example, a liner (not shown) may be formed on the sidewalls and bottom of the contact trench. The liner may be made of silicon nitride, although any other applicable dielectric may alternatively be used. The liner may be formed using a plasma enhanced chemical vapor deposition (PECVD) process, although other applicable processes, such as physical vapor deposition or a thermal process, may alternatively be used. The barrier layer (not shown) may be formed over the liner (if present) and may cover the sidewalls and bottom of the opening. The barrier layer may be formed using a process such as chemical vapor deposition (CVD), physical vapor deposition (PVD), plasma enhanced CVD (PECVD), plasma enhanced physical vapor deposition (PEPVD), atomic layer deposition (ALD), or any other applicable deposition processes. The barrier layer may be made of tantalum nitride, although other materials, such as tantalum, titanium, titanium nitride, or the like, may also be used.

Figure 2:
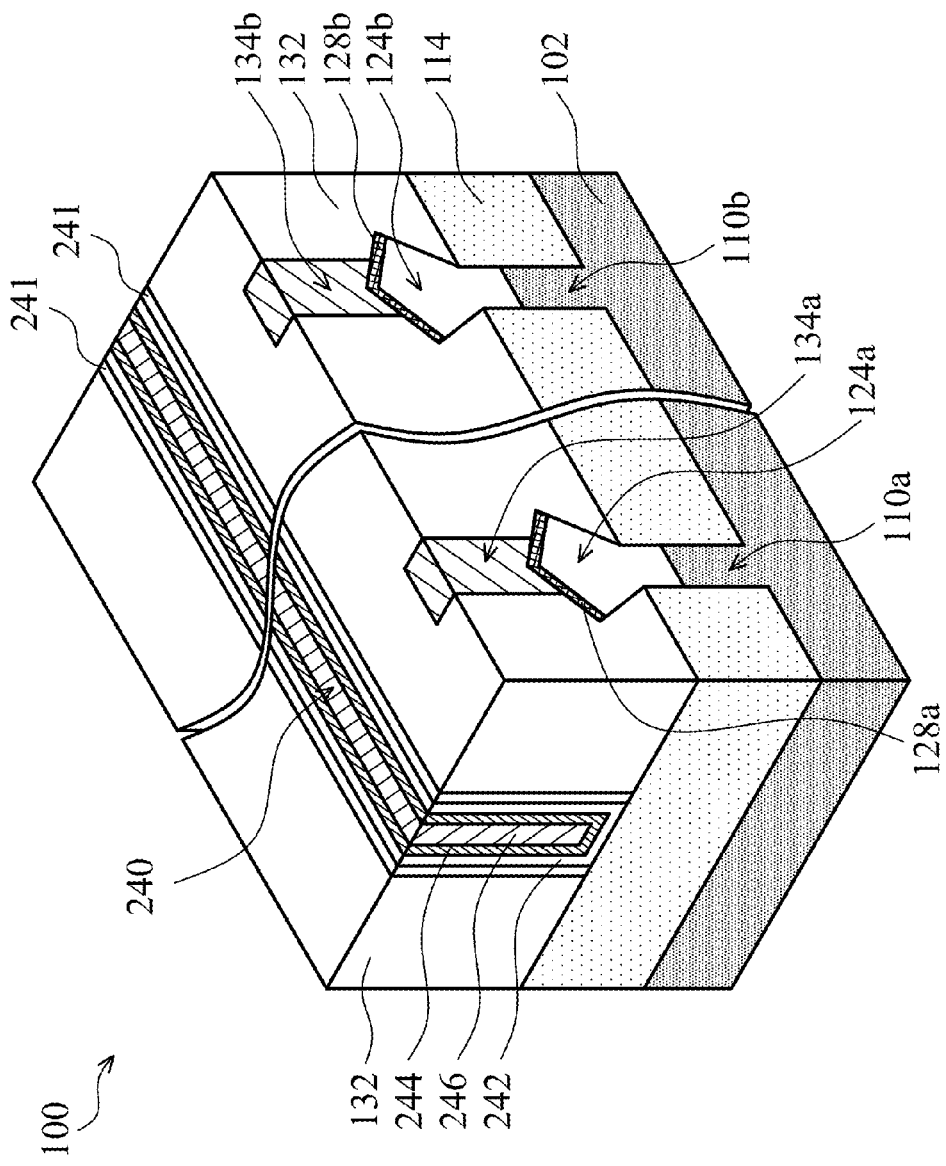
FIG. 2 is a perspective representation of a semiconductor structure formed by the processes shown in FIGS. 1A to 1K and described above in accordance with some embodiments.

FIG. 2 is a perspective representation of semiconductor structure 100 formed by the processes shown in FIGS. 1A to 1K and described above in accordance with some embodiments. Semiconductor structure 100 includes first fin structures 110a and second fin structures 110b formed over substrate 102 and a metal gate structure 240 is formed across first fin structures 132 and second fin structures 134. As described previously, a gate structure, such as a dummy gate structure, may be formed before first source/drain structure 124a and second source/drain structure 124b are formed, and the gate structure may be replaced by metal gate structure 240 after inter-layer dielectric layer 132 is formed. In addition, spacers 241 are formed on the sidewalls of metal gate structure 140 in accordance with some embodiments.

In some embodiments, spacers 241 are made of silicon nitride, silicon oxide, silicon oxynitride, silicon carbide, or other applicable dielectric materials. Spacers 241 may include a single layer or multiple layers. In some embodiments, metal gate structure 240 includes a gate dielectric layer 242, a work function metal layer 244, and a metal gate electrode layer 246. In some embodiments, gate dielectric layer 242 is made of high k dielectric materials. Examples of the high k dielectric material may include, but are not limited to, hafnium oxide ($HfO_2$), hafnium silicon oxide (HfSiO), hafnium silicon oxynitride (HfSiON), hafnium tantalum oxide (HfTaO), hafnium titanium oxide (HfTiO), hafnium zirconium oxide (HfZrO), metal oxides, metal nitrides, metal silicates, transition metal oxides, transition metal nitrides, transition metal silicates, oxynitrides of metals, metal aluminates, zirconium silicate, zirconium aluminate, silicon oxide, silicon nitride, silicon oxynitride, zirconium oxide, titanium oxide, aluminum oxide, or hafnium dioxide-alumina ($HfO_2$—$Al_2O_3$) alloy.

Work function metal layer 244 is formed over gate dielectric layer 242 in accordance with some embodiments. Work function metal layer 244 may be customized to have the proper work function. For example, if a P-type work function metal (P-metal) for a PMOS device is desired, TiN, WN, or W may be used. On the other hand, if an N-type work function metal (N-metal) for NMOS devices is desired, TiAl, TiAlN, or TaCN, may be used.

Metal gate electrode layer 246 is formed over work function metal layer 244 in accordance with some embodiments. In some embodiments, metal gate electrode layer 246 is made of a conductive material, such as aluminum, copper, tungsten, titanium, tantulum, titanium nitride, tantalum nitride, nickel silicide, cobalt silicide, TaC, TaSiN, TaCN, TiAl, TiAlN, or other applicable materials. Gate dielectric layer 242, work function metal layer 244, and metal gate electrode layer 246 may be formed by any applicable process to any applicable thickness.

It should be noted that additional layers, such as liner layers, interface layers, seed layers, adhesion layers, barrier layers, or the like, may be formed above and/or below gate dielectric layer 242, work function metal layer 244, and metal gate electrode layer 246. In addition, gate dielectric layer 242, work function metal layer 244, and metal gate electrode layer 246 may be made of one or more materials and/or may include one or more layers.

In addition, it should be noted that first fin structure 110a and second fin structure 110b may be formed adjacent to each other or may have additional structures formed between them, and the scope of the disclosure is not intended to be limited.

FIGS. 3A to 3E are cross-sectional representations of various stages of forming a semiconductor structure 100' in accordance with some embodiments. Some methods and materials used to form semiconductor structure 100' are similar to, or the same as, those used to form semiconductor structure 100 shown in FIGS. 1A to 1K and are not repeated herein.

More specifically, the methods and materials shown in FIGS. 1A to 1G and described previously may also be used to form semiconductor structure 100'. However, after first source/drain structure 124a and second source/drain structure 124b are formed (as shown in FIG. 1G) but before first metal layer 126a and second metal layer 126b are formed, inter-layer dielectric layer 132 is formed to cover first source/drain structure 124a and second source/drain structure 124b over substrate 102, as shown in FIG. 3A in accordance with some embodiments.

Figure 3A:
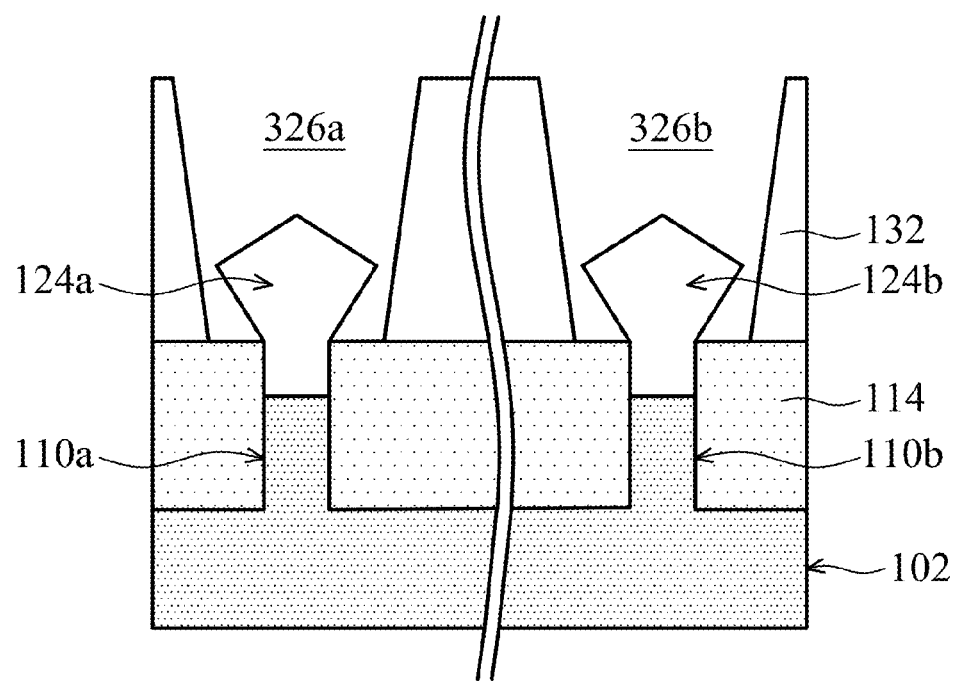
FIGS. 3A to 3E are cross-sectional representations of various stages of forming a semiconductor structure in accordance with some embodiments.

After inter-layer dielectric layer 132 is formed, a first contact trench 326a and a second contact trench 326b are formed in inter-layer dielectric layer 132 over first source/drain structure 124a and second source/drain structure 124b respectively, as shown in FIG. 3A in accordance with some embodiments. First contact trench 326a and second contact trench 326b may be formed by an etching process.

Figure 3B:
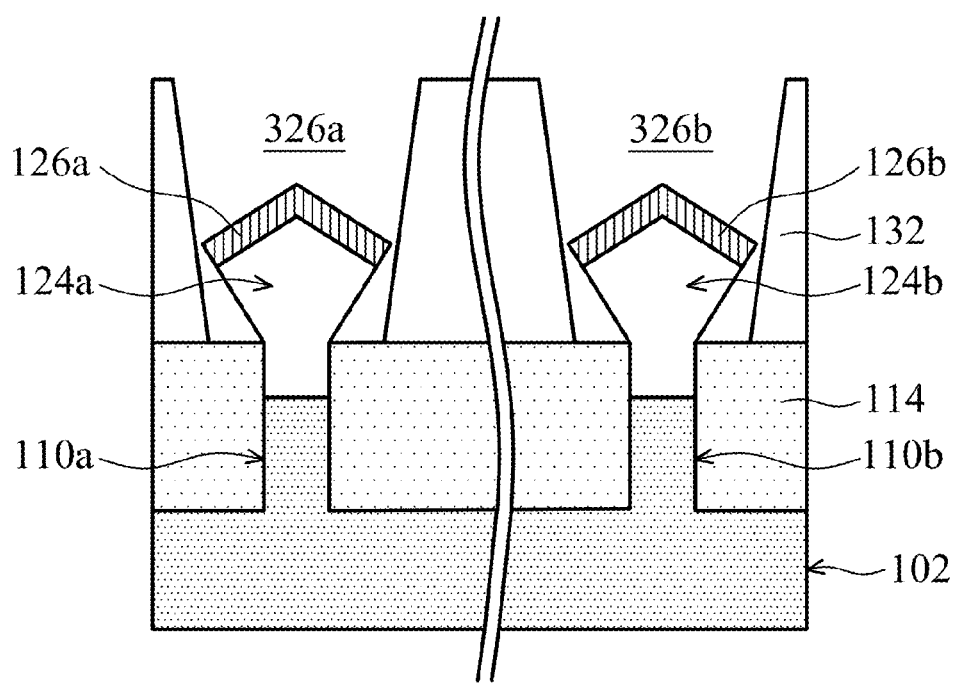

As shown in FIG. 3A, first source/drain structure 124a is exposed by first contact trench 326a, and second source/drain structure 124b is exposed by second contact trench 326b. Next, first metal layer 126a is formed over first source/drain structure 124a and second metal layer 126b is formed over second source/drain structure 124b, as shown in FIG. 3B in accordance with some embodiments. In some embodiments, first metal layer 126a and second metal layer 126b are formed by the same depositing process.

Figure 3C:
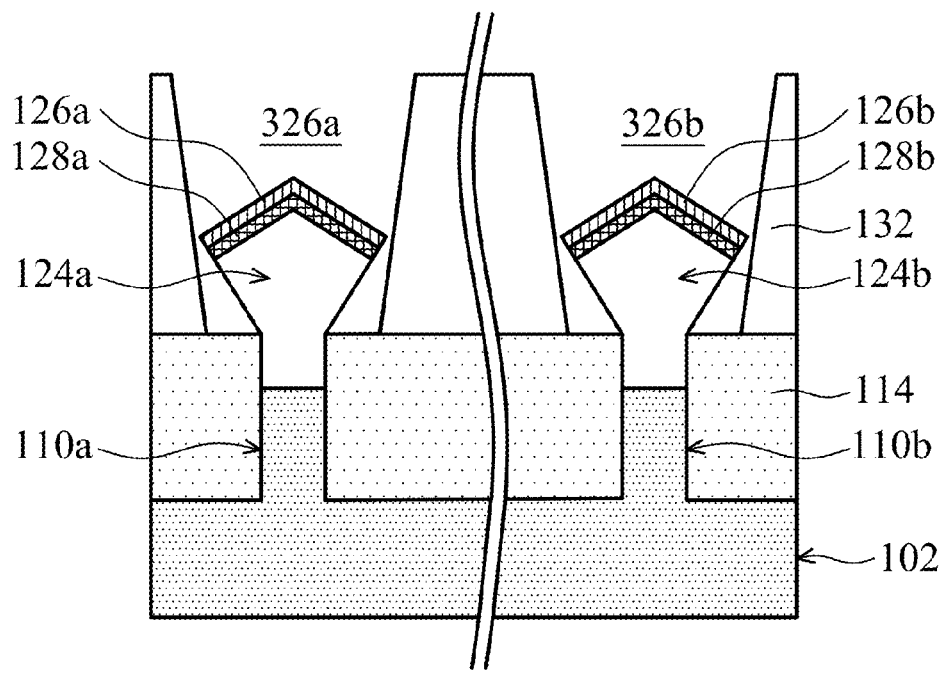

After first metal layer 126a and second metal layer 126b are formed, processes similar to those shown in FIGS. 1H to 1K and described previously are performed. More specifically, the annealing process is performed to form first metallic layer 128a and second metallic layer 128b, as shown in FIG. 3C in accordance with some embodiments.

Figure 3D:
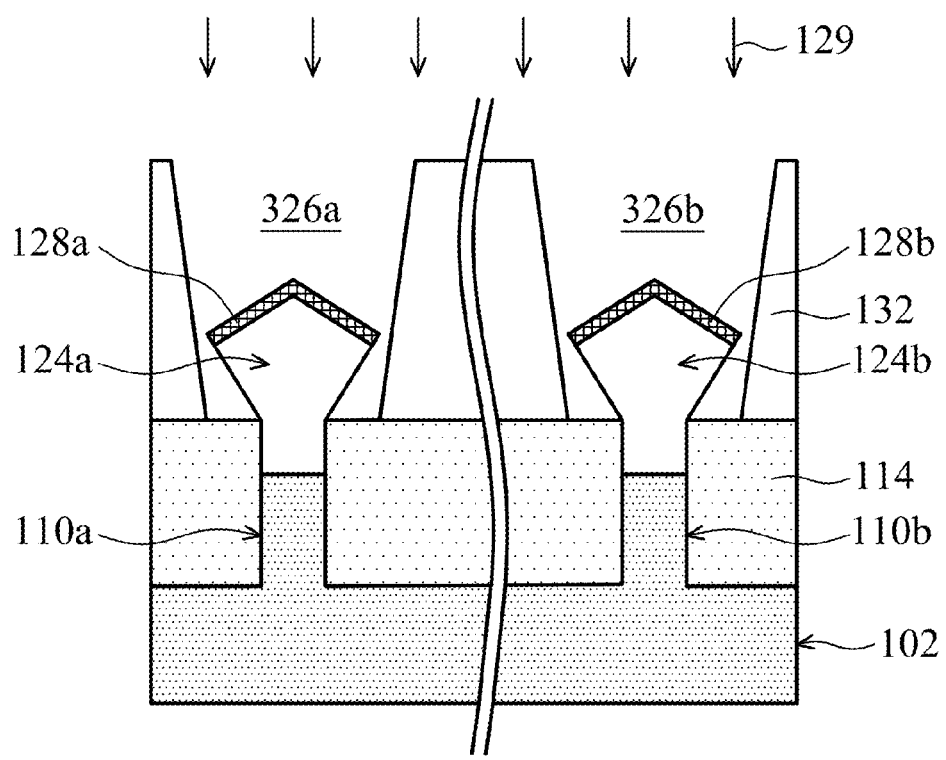

After first metallic layer 128a and second metallic layer 128b are formed, etching process 129 is performed to remove the unreacted portions of first metal layer 126a and second metal layer 126b, as shown in FIG. 3D in accordance with some embodiments. As described previously, the etchant used in etching process 129 includes HF and propylene carbonate and possesses great etching selectivity to the unreacted portion of first metal layer 126a and second metal layer 126b over first metallic layer 128a and second metallic layer 128b. Therefore, the unreacted portions of first metal layer 126a and second metal layer 126b can be fully removed.

In addition, since the etchant also possess great etching selectivity to the unreacted portion of first metal layer 126a and second metal layer 126b over dielectric materials such as $SiO_2$ and SiN, damage to inter-layer dielectric layer 132 and shallow trench isolation structure 114 can be reduced.

Figure 3E:
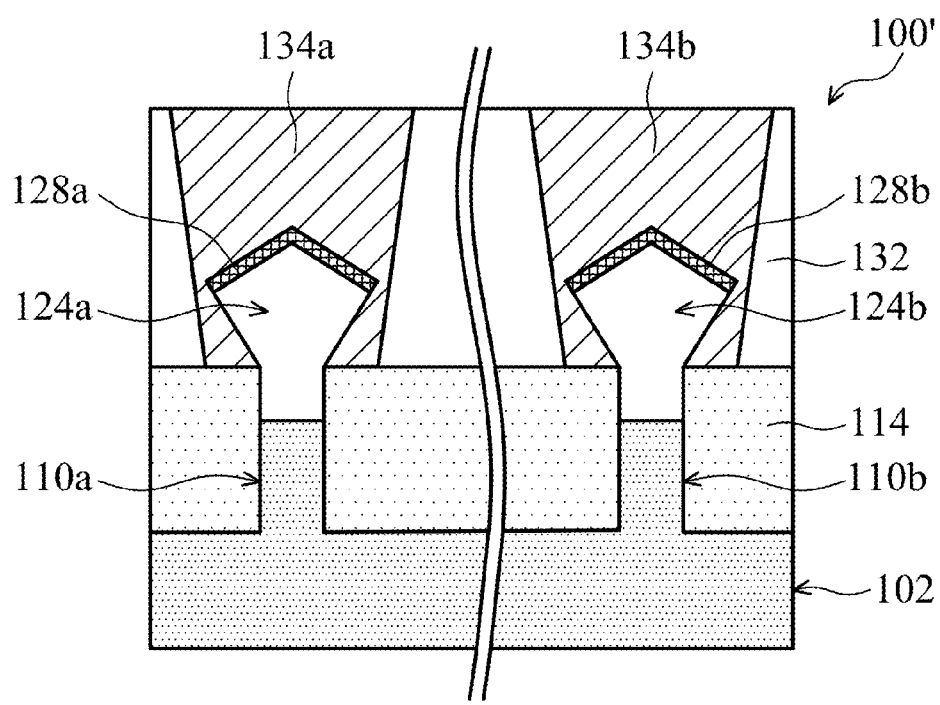

Next, first contact 134a is formed in first contact trench 326a, and second contact 134b is formed in second contact trench 326b, as shown in FIG. 3E in accordance with some embodiments.

Figure 4:
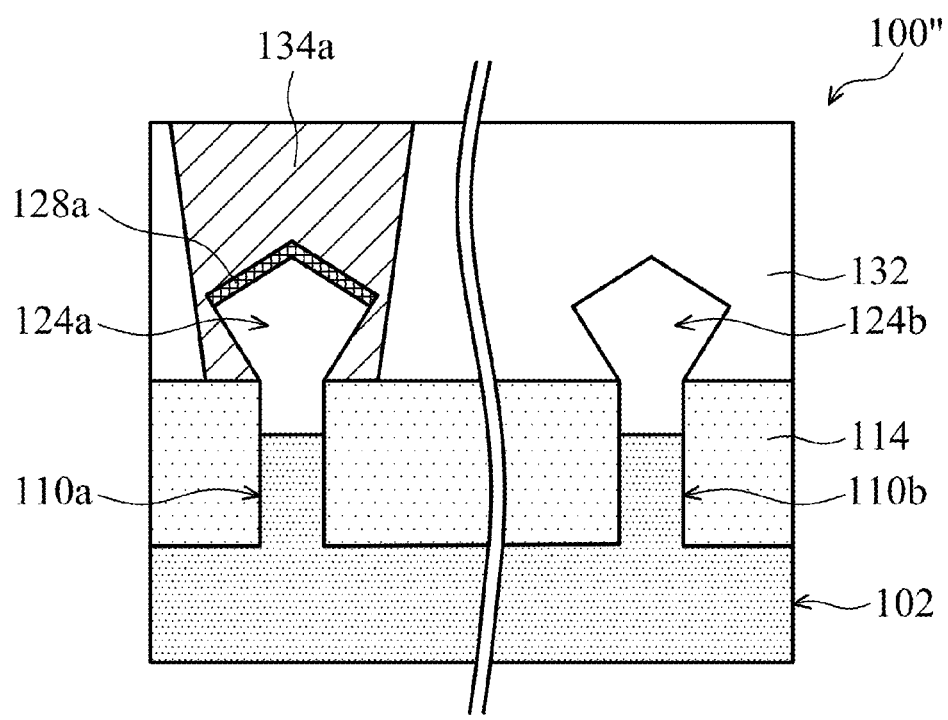
FIG. 4 is a cross-sectional representation of a semiconductor structures in accordance with some embodiments.

Although contacts and metallic layer are formed on both first source/drain structures 124a and second source/drain structure 124b of semiconductor structures 100 and 100' described previously, they are merely examples for better understanding the concept of the disclosure. FIG. 4 is a cross-sectional representation of a semiconductor structure 100" in accordance with some embodiments. Semiconductor structure 100" may be similar to, or the same as, semiconductor structure 100 and 100' shown in FIGS. 1A to 3E except only first contact 134a is formed on first source/drain structure 124a. As shown in FIG. 4, first contact 134a is formed to connect with first source/drain structure 134a but neither contacts nor metallic layers are formed on second source/drain structure 134b.

It should be noted that although the semiconductor structures shown in FIGS. 1A to 4 are fin field effect transistors (FinFET), the concept of the disclosure is not intended to be limited. For example, the method and materials described above, such as etching process 129, may also be used to form planar metal-oxide-semiconductor field effect transistors (planar MOSFET) or nanowire field effect transistors.

Figure 5:
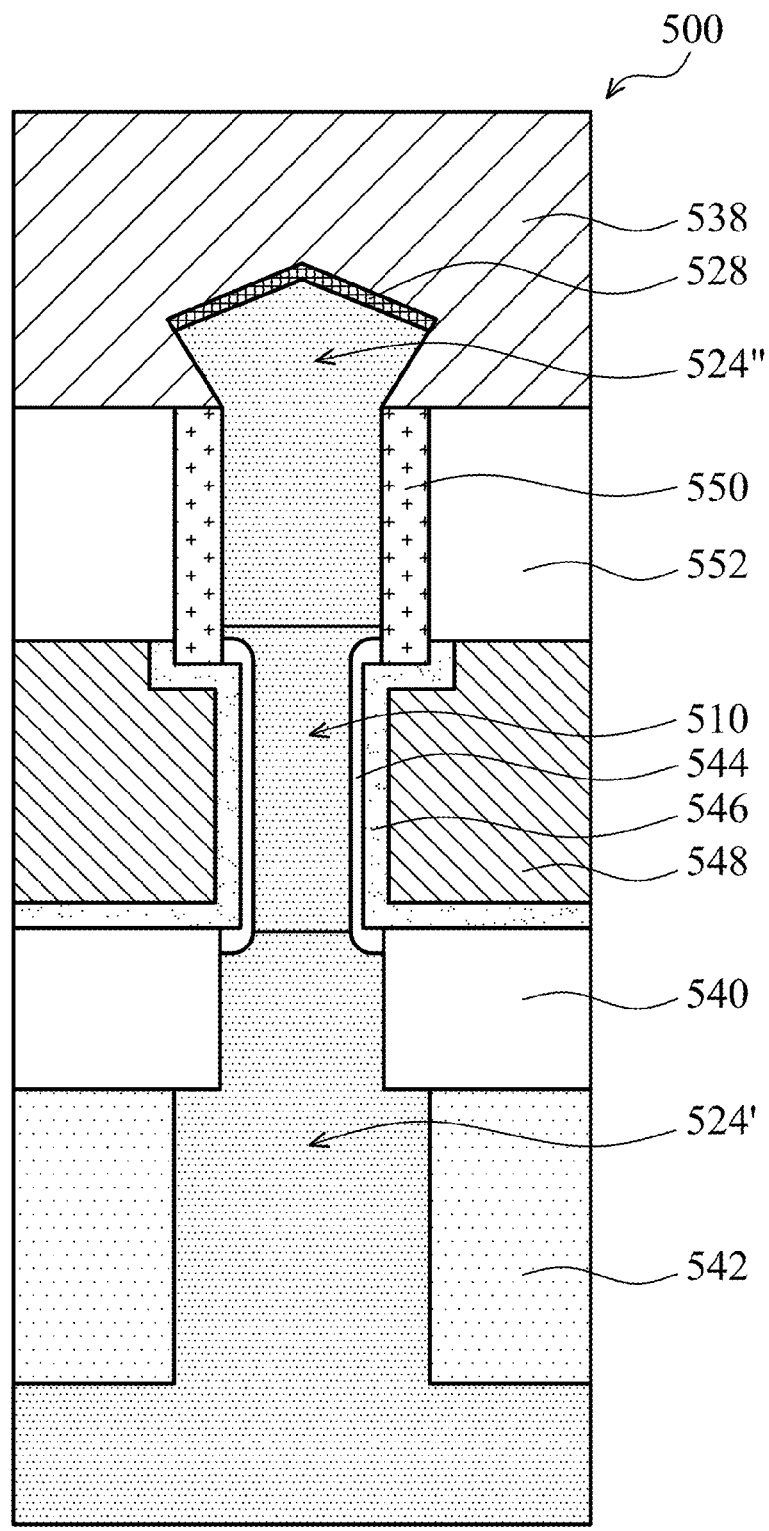
FIG. 5 is a cross-sectional representation of a nanowire field effect transistor structure in accordance with some embodiments.

FIG. 5 is a cross-sectional representation of a nanowire field effect transistor structure 500 in accordance with some embodiments. Nanowire field effect transistor structure 500 includes nanowire structure 510, and nanowire structure 510 includes a source structure 524' and a drain structure 524". In some embodiments, drain structure 524" has a diamond shaped structure similar to first source/drain structure 124a and second source/drain structure 124b described previously. In some embodiments, source structure 524' and drain structure 524" are raised source/drain structures in nanowire structure 510.

A metallic layer 528 is formed over drain structure 524" in accordance with some embodiments. Metallic layer 528 may be the same as, or similar to, first metallic layer 128a and second metallic layer 128b described previously. For example, metallic layer 528 may also be formed by forming a metal layer over drain structure 524", annealing the metal layer, removing the unreacted portion of metal layer by using an etchant. The etchant used to remove the unreacted portion of metal layer may be the same as that used in etching process 129 described previously.

After metallic layer 528 is formed, a contact 538 is formed over metallic layer 528 over drain structure 524", as shown in FIG. 5 in accordance with some embodiments. Contact 538 may be the same as, or similar to, first contact 138a and second contact 138b described previously. In some embodiments, contact 538 is a drain pad.

As shown in FIG. 5, nanowire field effect transistor structure 500 further includes a source spacer 540 and source metallic layer 542, such as silicide, formed adjacent to source structure 524'. Furthermore, a channel region of nanowire structure 510 positioned between source structure 524' and drain structure 524" is surrounded by an inter-layer 544, a high k dielectric layer 546, and a metal gate structure 548. A drain spacer 550 is formed adjacent to drain structure 524", and a gate spacer 552 is formed adjacent to metal gate structure 548.

It should be noted that FIGS. 1A to 5 have been simplified for the sake of clarity to better illustrate the concepts of the present disclosure. Additional features may be added to semiconductor structures 100, 100', 100", and nanowire field effect transistor structure 500, and some of the features described above can be replaced or eliminated in other embodiments.

As described previously, in etching process 129, the etchant including HF and propylene carbonate is used. The etchant possesses a relatively high etching selectivity over the metal layer (e.g. first metal layer 126a and second metal layer 126b) and the metallic layer (e.g. first metallic layer 128a and second metallic layer 128b), compared to using water-base acids (e.g. HCl, $H_2SO_4$, and $HNO_3$). Therefore, the unreacted metal layer can be fully removed.

It should be noted that, although high etching selectivity enable the unreacted metal layer to be fully removed. The etching rate of the metallic layer is also considered. More specifically, the etching rate of the metallic layer should be low enough so the removal of the metallic layer can be avoided. For example, although concentrated HCl (36%) possesses relatively high etching selectivity over Ni and NiInAs, it is not suitable to be use in the etching process of removing the unreacted Ni layer since the etching rate of NiInAs is still too high. However, the etchant used in etching process 129 possesses great etching selectivity over the metal layer and the metallic layer, and the etching rate of the metallic layer is low. Therefore, the etchant including HF and propylene carbonate can be used to remove the unreacted metal layer without removing too much metallic layer.

Furthermore, the solvent of the etchant used in etching process 129 is propylene carbonate, which is an organic solvent. The use of propylene carbonate may prevent the dielectric materials, such as SiN or $SiO_2$, from being etched by the etchant. Therefore, the etchant can also possess great etching selectivity to the unreacted portion of the metal layer over dielectric elements, such as inter-layer dielectric layer 132 and shallow trench isolation structure 114. As a result, etching process 129 can be performed even when dielectric elements are also present in the structure.

However, it should be noted that, not all organic solvent can achieve the same results. For example, organic solvent such as dimethyl sulfoxide (DMSO) may form a protection layer over the metal layer, such as a Ni layer, and therefore the etching rate of the metal layer in HF/DSMO may be very poor.

In addition, the etchant is applicable for both group IIIA-VA alloy and group IVA element (or alloy). Accordingly, when a semiconductor structure includes two sets of source/drain structures (e.g. first source/drain structure 124a and second source/drain structure 124b), the unreacted portion of both of the metal layers can be removed in the same etching process 129. As a result, complicated masking and etching processes are not required, and the cost of forming the structure is reduced.

Accordingly, self-aligned contacts (e.g. first contact 134a and second contact 134b) can be formed over the metallic layer (e.g. first metallic layer 128a and second metallic layer 128b) over source/drain structures (e.g. first source/drain structure 124a and second source/drain structure 124b). In addition, the etchant is environmentally friendly and has fewer safety and waste concerns. Furthermore, etching process 129 can be easily implemented in the original manufacturing process without performing complicated processes or using unusual chemicals. Therefore, the cost of the manufacturing may be reduced.

Embodiments for forming a semiconductor structure are provided. The semiconductor structure includes a source/drain structure, a metallic layer formed over the source/drain structure, and a contact formed over the metallic layer. The metallic layer is formed by forming a metal layer over the source/drain structure, annealing the metal layer, and removing the unreacted metal layer. The unreacted metal layer is removed by an etching process using an etchant including HF and propylene carbonate. The etchant has good selectivity toward the metal layer and the metallic layer, and therefore the unreacted metal layer can be fully removed by performing the etching process.

In some embodiments, a method for manufacturing a semiconductor structure is provided. The method for manufacturing a semiconductor structure includes forming a source/drain structure over a substrate and forming a metal layer on the source/drain structure. The method for manufacturing a semiconductor structure further includes reacting a portion of the metal layer with the source/drain structure to form a metallic layer on the source/drain structure. The method for manufacturing a semiconductor structure further includes removing an unreacted portion of the metal layer on the metallic layer by an etching process. In addition, the etching process includes using an etchant including HF and propylene carbonate, and a volume ratio of HF to propylene carbonate in the etchant is in a range from about 1:10 to about 1:10000.

In some embodiments, a method for manufacturing a semiconductor structure is provided. The method for manufacturing a semiconductor structure includes forming a source/drain structure over a substrate and forming a metal layer over the source/drain structure. The method for manufacturing a semiconductor structure further includes performing an annealing process so that a portion of the metal layer reacts with the source/drain structure to form a metallic layer on the source/drain structure. The method for manufacturing a semiconductor structure further includes removing an unreacted portion of the metal layer on the metallic layer by an etching process and forming a contact over the metallic layer. In addition, the etching process includes using an etchant including HF and propylene carbonate, and a volume ratio of HF to propylene carbonate in the etchant is in a range from about 1:50 to about 1:200.

In some embodiments, a method for manufacturing a semiconductor structure is provided. The method for manufacturing a semiconductor structure includes forming a first source/drain structure over a substrate and the first source/drain structure is made of group IIIA-VA alloy. The method for manufacturing a semiconductor structure further includes forming a second source/drain structure over the substrate and the second source/drain structure is made of group IVA element or group IVA alloy. The method for manufacturing a semiconductor structure further includes forming a first metal layer over the first source/drain structure and a second metal layer over the second source/drain structure. The method for manufacturing a semiconductor structure further includes performing an annealing process so that a portion of the first metal layer reacts with the first source/drain structure to form a first metallic layer on the first source/drain structure and a portion of the second metal layer reacts with the second source/drain structure to form a second metallic layer on the second source/drain structure. The method for manufacturing a semiconductor structure further includes performing an etching process to remove an unreacted portion of the first metal layer on the first metallic layer and an unreacted portion of the second metal layer on the second metallic layer. In addition, the etching process includes using an etchant including HF and propylene carbonate, and a volume ratio of HF to propylene carbonate in the etchant is in a range from about 1:50 to about 1:200.

Comparative Examples 1 to 5

A blanket wafer made of Si was provided. An InAs layer was formed over the blanket wafer by an epitaxial growth process. After the InAs layer was formed, a Ni layer was deposited on the InAs layer. An annealing process was performed on the Ni layer to form a NiInAs layer. After the annealing process, an etching process was performed to remove unreacted Ni layer at 70° C. Different etchants were used in comparative examples 1 to 5. The etchant used in the etching process are shown in Table 1.

TABLE 1

|  | Acid | Solvent (Donor number) | Volume ratio of acid to solvent |
| --- | --- | --- | --- |
| Comparative example 1 | $H_2SO_4$ | PC (15.1) | 1:100 |
| Comparative example 2 | $H_2SO_4$ | EC (16.4) | 1:100 |
| Comparative example 3 | $H_2SO_4$ | DMSO (30) | 1:100 |
| Comparative example 4 | $H_2SO_4$ | PC (15.1) | 1:100 |
| Comparative example 5 | BHF | PC (15.1) | 1:100 |

Example 1

A blanket wafer made of Si was provided. An InAs layer was formed over the blanket wafer by an epitaxial growth process. After the InAs layer was formed, a Ni layer was deposited on the InAs layer. An annealing process was performed on the Ni layer to form a NiInAs layer. After the annealing process, an etching process was performed to remove unreacted Ni layer at 70° C. The etchant used in the etching process includes HF (49%) and propylene carbonate (PC). The volume ratio of HF to PC was 1:100.

Solvent Effect

Figure 6:
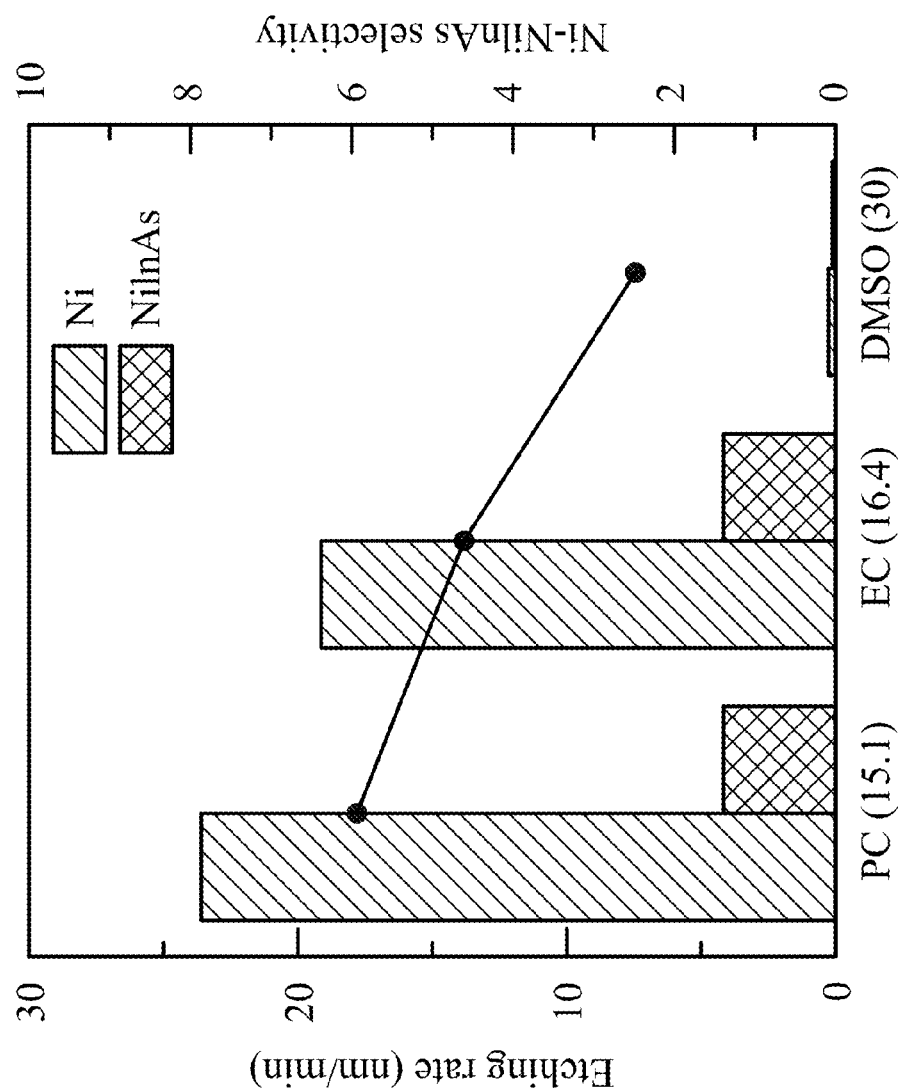
FIG. 6 shows the etching rate and the Ni—NiInAs etching selectivity in accordance with some embodiments.

FIG. 6 shows the etching rate and the Ni—NiInAs etching selectivity in Comparative Examples 1 to 3. After the etching process, the thicknesses of the Ni layer and the NiInAs layer were measured by X-ray fluorescence (XRF), and the etching rate was calculated accordingly. As shown in FIG. 6, $H_2SO_4$ was diluted by propylene carbonate (PC), ethylene carbonate (EC), or dimethyl sulfoxide (DMSO) in the etching process, and the etching rate of Ni reduced as the donor number of the solvents increased. In comparative examples 1 to 3, $H_2SO_4$/PC had the best etching selectivity over Ni layer and NiInAs layer. However, the etching selectivity was still not high enough. In addition, $H_2SO_4$/DMSO had a poor etching rate toward both the Ni layer and the NiInAs layer.

The result was further examined by electrochemical voltammetry. More specifically, $H_2SO_4$/PC and $H_2SO_4$/DMSO were used as electrolyte. Working electrode (WE) was Ni (on Si). Voltage was applied between counter electrode (CE) and reference electrode (RE). The current was extracted. The reaction was performed under room temperature.

Figure 7:
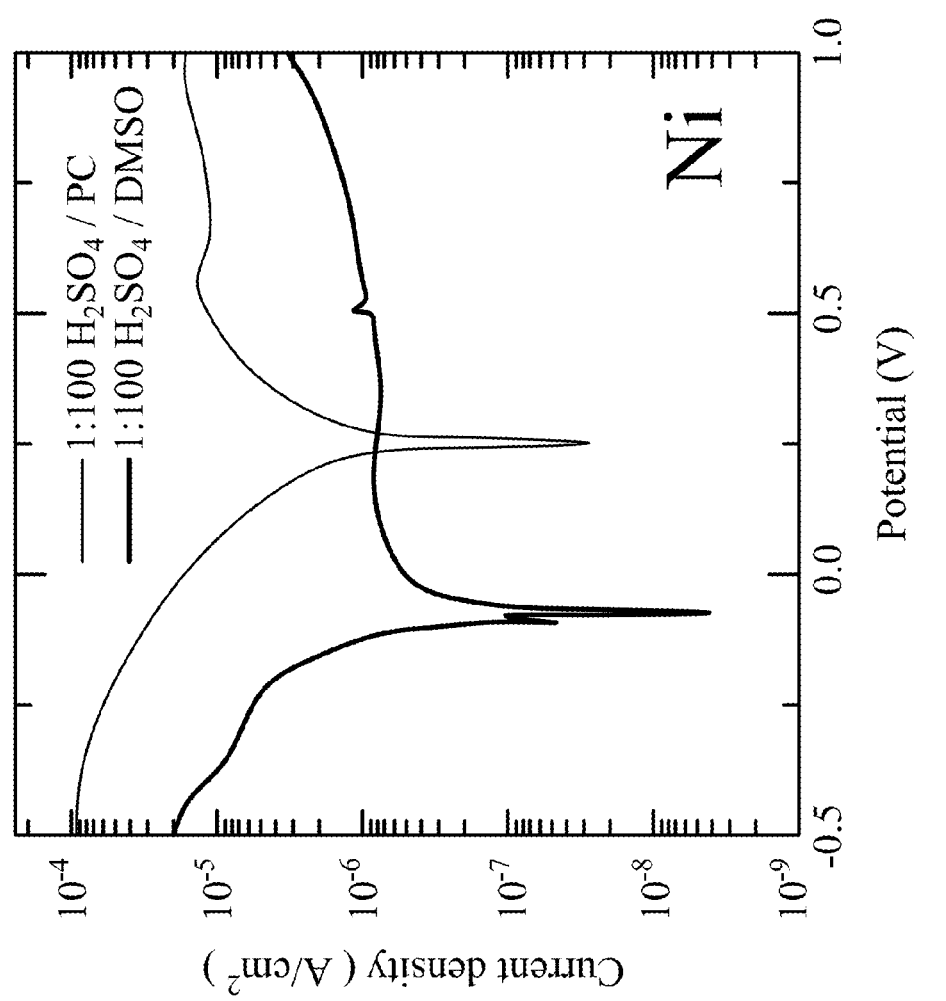
FIG. 7 shows the current density when using either $H_2SO_4$/PC or $H_2SO_4$/DMSO as its electrolyte in accordance with some embodiments.

FIG. 7 shows the current density when using either $H_2SO_4$/PC or $H_2SO_4$/DMSO as its electrolyte. As shown in FIG. 7, when $H_2SO_4$/DMSO was used, anodic current was suppressed in DMSO. The result suggested that Ni surface was passivated by DMSO molecules due to its higher donor number (30). Therefore, the etching rate of Ni was relatively low in $H_2SO_4$/DMSO.

On the other hand, when $H_2SO_4$/PC was used, the resulting current density was relatively high. That is, Ni was anodically etched during the process.

pH Effect

Figure 8:
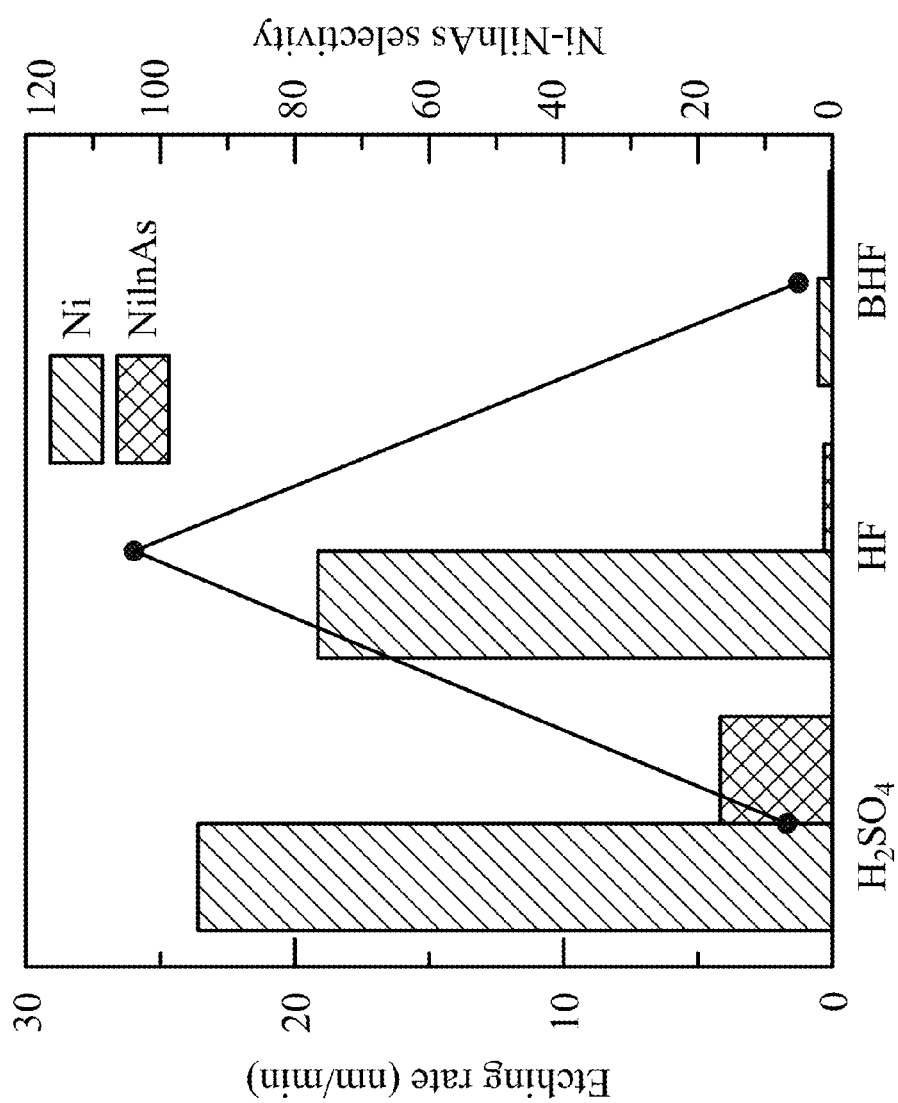
FIG. 8 shows the etching rate and the Ni—NiInAs etching selectivity in accordance with some embodiments.

FIG. 8 shows the etching rate and the Ni—NiInAs etching selectivity in Comparative examples 4 and 5 and Example 1. After the etching process, the thickness of the Ni layer and NiInAs was measured by XRF, and the etching rate was calculated accordingly. As shown in FIG. 8, $H_2SO_4$, HF, and BHF were diluted by PC in the etching process.

As shown in FIG. 8, $H_2SO_4$ is a strong acid, and the etching rate of Ni layer was very high. However, the etching rate of the NiInAs layer in $H_2SO_4$ was too high. On the other hand, although the etching rate of the NiInAs layer in BHF was very low, the etching rate of Ni layer in BHF was also too low to remove the Ni layer.

Therefore, HF/PC had the best etching selectivity over the Ni layer and the NiInAs layer. In addition, the etching selectivity in HF/PC was greater than 100, which was high enough to remove the unreacted metal layer over the metallic layer as shown in FIGS. 1A to 5 and described previously.

Etching Rate of Different Materials

A blanket wafer made of Si was provided. A material layer was deposited on the wafer. The material layer was a Ni layer, a $SiO_2$ layer, or a SiN layer. An etching process was performed to etch the material layer at 70° C. The etching process included using HF/PC in a volume ratio shown in Table 2.

TABLE 2

|  | Acid | Solvent | HF:PC = 1:x |
| --- | --- | --- | --- |
| Example 1 | HF | PC | 1:100 |
| Example 2 | HF | PC | 1:200 |
| Example 3 | HF | PC | 1:500 |

Figure 9:
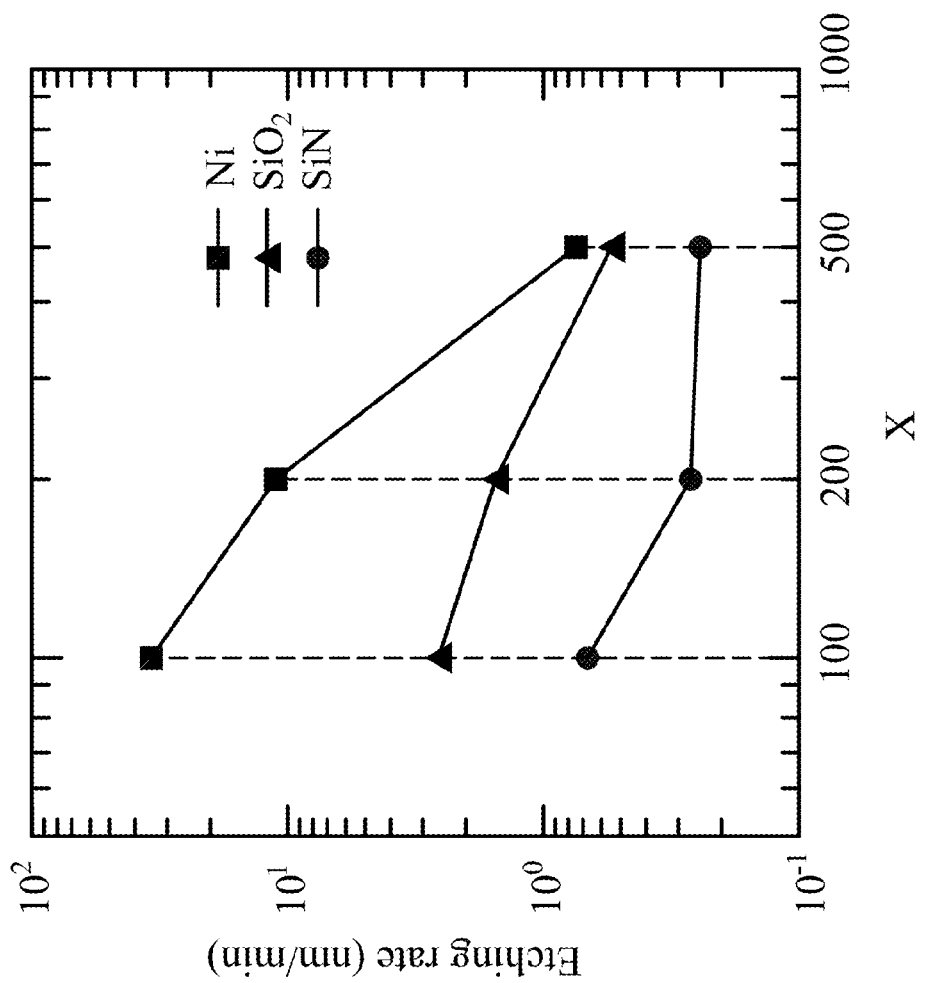
FIG. 9 shows the etching rate of different material layers in HF/PC in different volume ratio in accordance with some embodiments.

FIG. 9 shows the etching rate of different material layers in HF/PC in different volume ratio. After the etching process, the thicknesses of the material layers were measured by ellipsometer, and the etching rate was calculated accordingly. As shown in FIG. 9, when the ratio of HF to PC is 1:100 or 1:200, the etchant had a relatively high etching selectivity between Ni and $SiO_2$ (or SiN).

As described previously, since HF/PC has great selectivity toward Ni and NiInAs, it may be used as the etchant in the etching process to remove the unreacted metal layer over the metallic layer. However, during the etching process, other material layers, such as $SiO_2$ and SiN layers, may also be contacted with the etchant. Therefore, etching selectivity between Ni, $SiO_2$, and SiN layers are also concerned. As shown in FIG. 9, it was found that HF/PC may also be applied to an etching process requiring a relatively high Ni and $SiO_2$ (or SiN) etching selectivity.

Etching Rate of Different Temperature

A blanket wafer made of Si was provided. A material layer was deposited on the wafer. The material layer was a Ni layer, a $SiO_2$ layer, or a SiN layer. Etching processes were performed to etch the material layer under 25° C., 50° C. or 75° C. The etching processes included using HF/PC (1:100).

Figure 10:
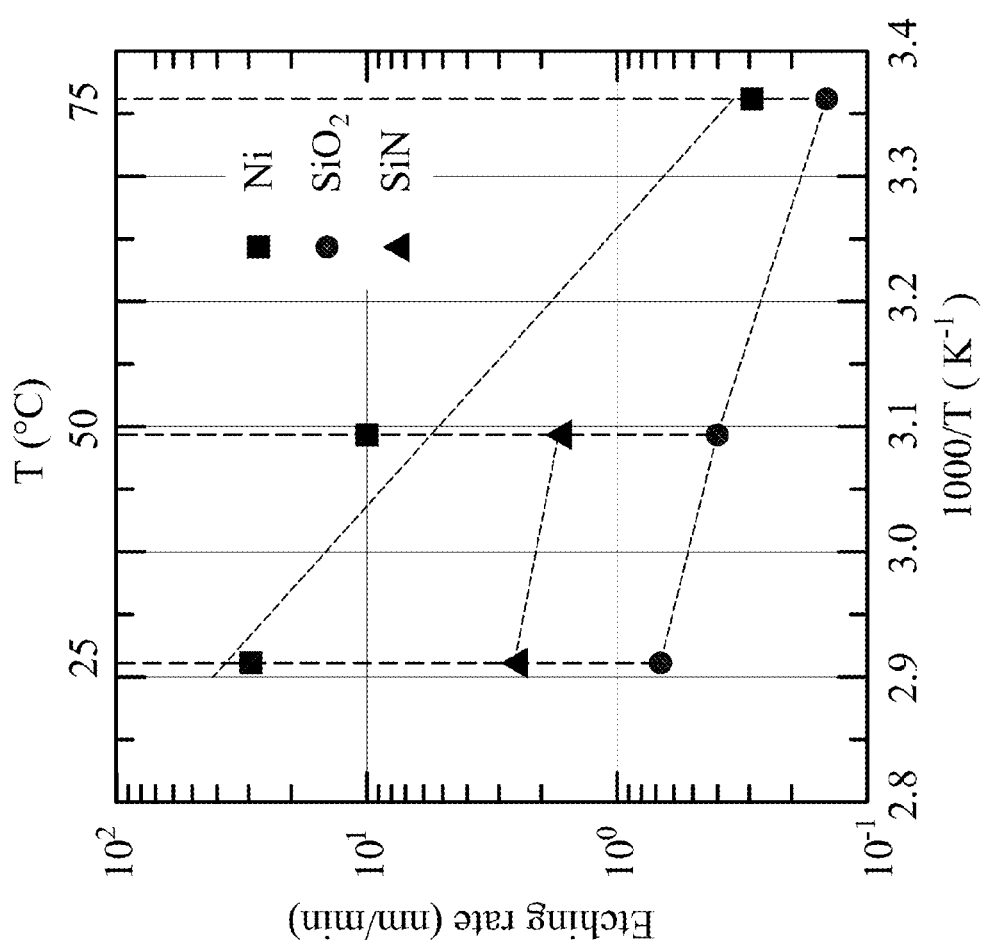
FIG. 10 shows the etching rate of the Ni layer, $SiO_2$ layer, or SiN layer in HF/PC (1:100) under different etching temperatures in accordance with some embodiments.

FIG. 10 shows the etching rate of Ni layer, $SiO_2$ layer, or SiN layer in HF/PC (1:100) under different etching temperature. As shown in FIG. 10, the etchant rate of Ni layer was more sensitive to the temperature, compared to that of $SiO_2$ layer or SiN layer. Therefore, when the temperature was raised, the etchant rate of Ni layer was improved but that of $SiO_2$ layer or SiN layer was not. Accordingly, when the etching process was performed at a temperature over 50° C., the etchant had a relatively high etching selectivity toward Ni and $SiO_2$ (or SiN).

Orientation and Annealing-Temperature Effect

An InAs bulk wafer (100) and an InAs bulk wafer (111) were provided. Ni layers were deposited on the InAs bulk wafer (100) and an InAs bulk wafer (111). A rapid thermal annealing (RTA) process was performed on the Ni layer to form a NiInAs layer. The annealing process was performed under 200° C. or 300° C. After the annealing process, an etching process was performed to remove unreacted Ni layer at 70° C. The etchant used in the etching process included HF/PC or $HCl/H_2O$. The volume ratio of HF to PC was 1:100, and the volume ratio of HCl to $H_2O$ was 1:10. After the etching process, the thicknesses of the material layers were measured by XRF, and the etching rate was calculated accordingly. The result is shown in Table 3.

The etching rate of Ni and NiInAs with different orientations were examined, and $HCl/H_2O$ was used as a comparative example of the etchant. As shown in Table 3, when $HCl/H_2O$ was used as the etchant, etching rate of NiInAs was very high, and therefore the etching selectivity of Ni over NiInAs was very poor. On the other hand, when HF/PC was used as the etchant, although the etching rate of Ni and NiInAs had changed due to the orientation difference of the substrates, the etching rate of NiInAs was still relatively low. Therefore, the etching selectivity of Ni over NiInAs was still high. Accordingly, HF/PC can be used in an etching process with good etching selectivity of Ni over NiInAs even though the orientation of the substrate may be different.

Furthermore, the etching rate of the NiInAs layer was not affected by the annealing temperature, as shown in Table 3. The resulting structures were further analyzed by transmission electron microscope (TEM) (not shown). It was found that when HF/PC was used as the etchant, the NiInAs layer showed a smooth top surface after the etching process when the annealing process was performed under a temperature below 300° C. In addition, an abrupt interface was shown between the NiInAs layer and the InAs substrate.

TABLE 3

| | Substrate | | | | | | | |
| --- | --- | --- | --- | --- | --- | --- | --- | --- |
| | InAs (100) | | | | InAs (111) | | | |
| | RTA temperature | | | | | | | |
| | 200° C. | | 300° C. | | 200° C. | | 300° C. | |
| Etchant | HF/PC (1:100) | $HCl/H_2O$ (1:10) | HF/PC (1:100) | $HCl/H_2O$ (1:10) | HF/PC (1:100) | $HCl/H_2O$ (1:10) | HF/PC (1:100) | $HCl/H_2O$ (1:10) |
| Ni etching rate (nm/min) | 18.8 | 18.3 | 18.8 | 18.3 | 18.8 | 18.3 | 18.8 | 18.3 |
| NiInAs etching rate (nm/min) | 0.138 | 24.0 | 0.216 | 55.3 | 0.684 | 101 | 0.0342 | 56.0 |
| Ni—NiInAs Selectivity | 136 | 0.761 | 87.0 | 0.331 | 27.5 | 0.181 | 550 | 0.326 |

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for manufacturing a semiconductor structure, comprising:
   forming a source/drain structure over a substrate;
   forming a metal layer on the source/drain structure;
   reacting a portion of the metal layer with the source/drain structure to form a metallic layer on the source/drain structure; and
   removing an unreacted portion of the metal layer on the metallic layer by an etching process;
   wherein the etching process comprises using an etchant comprising HF and propylene carbonate, and a volume ratio of HF to propylene carbonate in the etchant is in a range from about 1:10 to about 1:10000.

2. The method for manufacturing a semiconductor structure as claimed in claim 1, wherein the etching process is performed at a temperature in a range from about 20° C. to about 150° C.

3. The method for manufacturing a semiconductor structure as claimed in claim 1, wherein the metal layer is made of Ni, Co, Mo, Ti, Al, Sn, Pd, Pt, Au, Ag, or Cu.

4. The method for manufacturing a semiconductor structure as claimed in claim 1, wherein the source/drain structure is made of SiGe, Ge, GaAs, InAs, InGaAs, InAlAs, InP, InAlP, InN, GaN, InGaN, InGaP, GaSb, InSb, or InAsSbP.

5. The method for manufacturing a semiconductor structure as claimed in claim 1, wherein an etching rate of the unreacted portion of the metal layer is greater than twenty times an etching rate of the metallic layer during the etching process.

6. The method for manufacturing a semiconductor structure as claimed in claim 1, wherein the portion of the metal layer reacts with the source/drain structure under a temperature no greater than 400° C.

7. The method for manufacturing a semiconductor structure as claimed in claim 1, wherein the source/drain structure is a raised source/drain structure formed in a fin structure over the substrate.

8. The method for manufacturing a semiconductor structure as claimed in claim 1, wherein the source/drain structure is a raised source/drain structure formed in a nanowire structure over the substrate.

9. A method for manufacturing a semiconductor structure, comprising:
   forming a source/drain structure over a substrate;
   forming a metal layer over the source/drain structure;
   performing an annealing process so that a portion of the metal layer reacts with the source/drain structure to form a metallic layer on the source/drain structure;
   removing an unreacted portion of the metal layer on the metallic layer by an etching process; and
   forming a contact over the metallic layer,
   wherein the etching process comprises using an etchant comprising HF and propylene carbonate, and a volume ratio of HF to propylene carbonate in the etchant is in a range from about 1:50 to about 1:200.

10. The method for manufacturing a semiconductor structure as claimed in claim 9, wherein the annealing process is performed under a temperature no greater than 400° C.

11. The method for manufacturing a semiconductor structure as claimed in claim 9, wherein the etching process is performed at a temperature in a range from about 50° C. to about 100° C.

12. The method for manufacturing a semiconductor structure as claimed in claim 9, wherein the metal layer is made of Ni, Co, Mo, Ti, Al, Sn, Pd, Pt, Au, Ag, or Cu.

13. The method for manufacturing a semiconductor structure as claimed in claim 9, wherein the source/drain structure is made of GaAs, InAs, InGaAs, InAlAs, InP, InAlP, InN, GaN, InGaN, InGaP, GaSb, InSb, or InAsSbP.

14. The method for manufacturing a semiconductor structure as claimed in claim 9, wherein an etching rate of the unreacted portion of the metal layer is greater than twenty times an etching rate of the metallic layer during the etching process.

15. A method for manufacturing a semiconductor structure, comprising:
   forming a first source/drain structure over a substrate, wherein the first source/drain structure is made of group IIIA-VA alloy;
   forming a second source/drain structure over the substrate, wherein the second source/drain structure is made of group IVA element or group IVA alloy;
   forming a first metal layer over the first source/drain structure and a second metal layer over the second source/drain structure;
   performing an annealing process so that a portion of the first metal layer reacts with the first source/drain structure to form a first metallic layer on the first source/drain structure and a portion of the second metal layer reacts with the second source/drain structure to form a second metallic layer on the second source/drain structure; and
   performing an etching process to remove an unreacted portion of the first metal layer on the first metallic layer and an unreacted portion of the second metal layer on the second metallic layer;
   wherein the etching process comprises using an etchant comprising HF and propylene carbonate, and a volume ratio of HF to propylene carbonate in the etchant is in a range from about 1:50 to about 1:200.

16. The method for manufacturing a semiconductor structure as claimed in claim 15, wherein the etching process is performed at a temperature in a range from about 50° C. to about 100° C.

17. The method for manufacturing a semiconductor structure as claimed in claim 15, wherein the first metal layer and second metal layer are both made of Ni.

18. The method for manufacturing a semiconductor structure as claimed in claim 15, wherein the first source/drain structure is made of GaAs, InAs, InGaAs, InAlAs, InP, InAlP, InN, GaN, InGaN, InGaP, GaSb, InSb, or InAsSbP.

19. The method for manufacturing a semiconductor structure as claimed in claim 18, wherein the second source/drain structure is made of Ge or SiGe.

20. The method for manufacturing a semiconductor structure as claimed in claim 15, wherein an etching rate of the unreacted portion of the metal layer is greater than twenty times an etching rate of the metallic layer during the etching process.

* * * * *